United States Patent
Weng et al.

(10) Patent No.: US 12,431,416 B2
(45) Date of Patent: Sep. 30, 2025

(54) CHIP PACKAGE WITH INTEGRATED CURRENT CONTROL

(71) Applicant: XILINX, INC., San Jose, CA (US)

(72) Inventors: Li-Sheng Weng, San Diego, CA (US); Chun-Yuan Cheng, Zhubei (TW); Chao-Chin Lee, Zhunan Township (TW)

(73) Assignee: XILINX, INC., San Jose, CA (US)

( * ) Notice: Subject to any disclaimer, the term of this patent is extended or adjusted under 35 U.S.C. 154(b) by 775 days.

(21) Appl. No.: 17/718,220

(22) Filed: Apr. 11, 2022

(65) Prior Publication Data
US 2023/0326842 A1   Oct. 12, 2023

(51) Int. Cl.
*H01L 23/498* (2006.01)
*H01L 23/00* (2006.01)

(52) U.S. Cl.
CPC .. *H01L 23/49822* (2013.01); *H01L 23/49827* (2013.01); *H01L 24/08* (2013.01)

(58) Field of Classification Search
CPC ......... H01L 23/49822; H01L 23/49827; H01L 24/08; H01L 23/49838; H01L 23/49816; H01L 23/49833; H01L 23/50
See application file for complete search history.

(56) References Cited

U.S. PATENT DOCUMENTS

| 12,107,060 B2 * | 10/2024 | Elsherbini | H01L 24/08 |
| 2021/0082825 A1 * | 3/2021 | Strong | H01L 23/5389 |
| 2021/0398980 A1 * | 12/2021 | Zerbe | A01K 67/364 |

\* cited by examiner

*Primary Examiner* — Jonathan Han
(74) *Attorney, Agent, or Firm* — Patterson + Sheridan, LLP

(57) ABSTRACT

A chip package and method for fabricating the same are provided that includes a power delivery network (PDN) with non-uniform electrical conductance. The electrical conductance through each current path of the PDN may be selected to balance the distribution of current flow across the current paths through the chip package, thus compensating for areas of high and low current draw found in conventional designs.

20 Claims, 7 Drawing Sheets

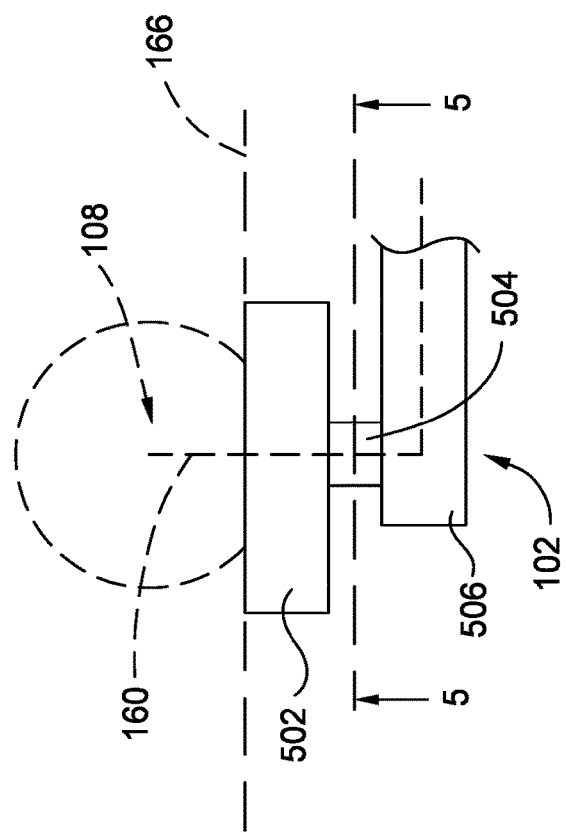
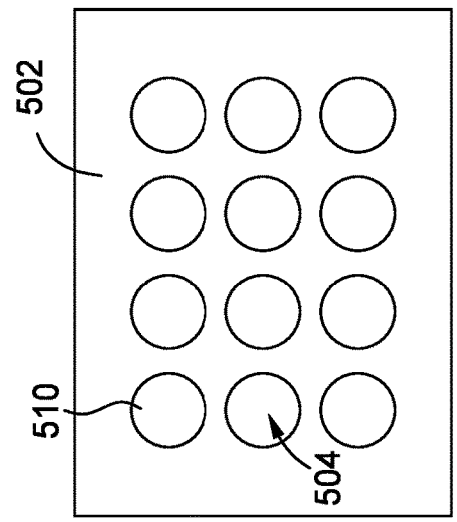
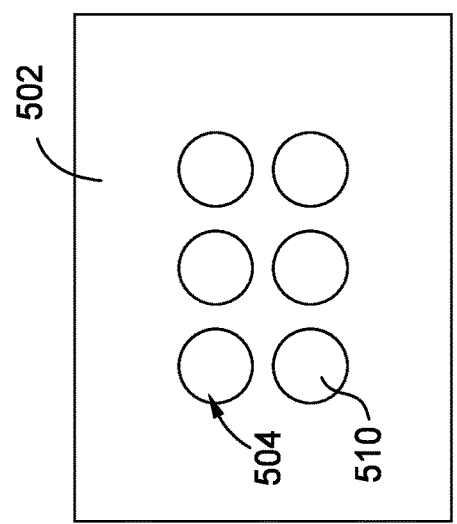
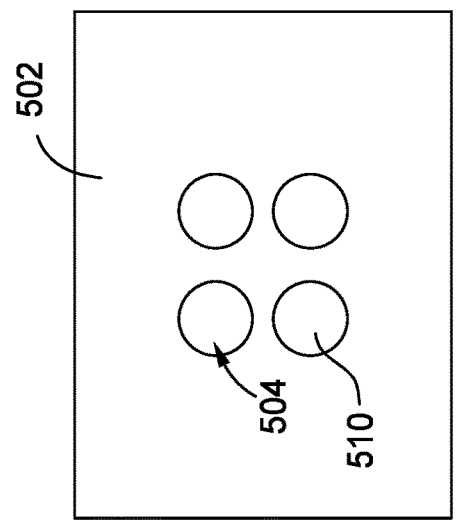

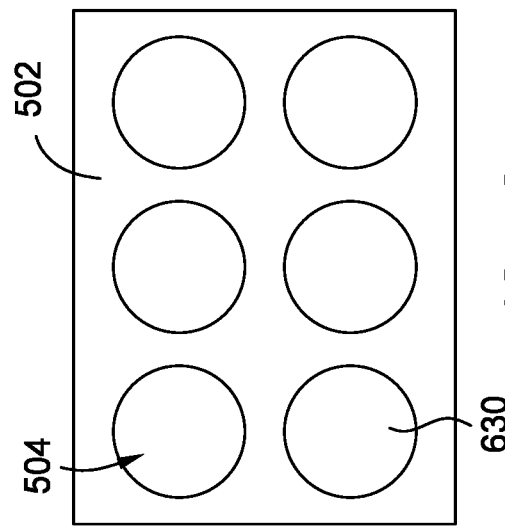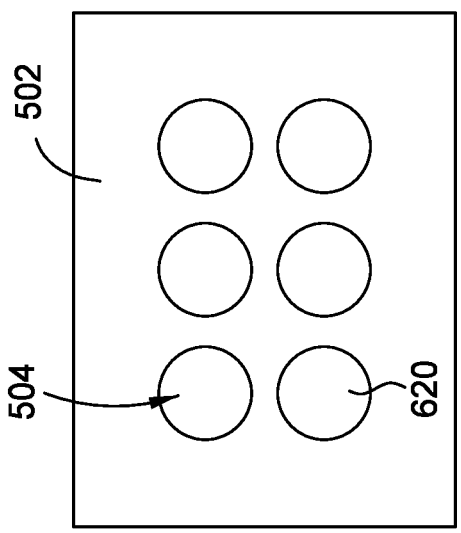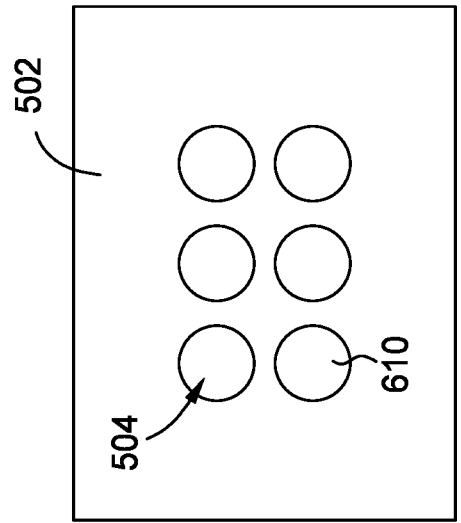

CHIP PACKAGE WITH INTEGRATED CURRENT CONTROL

TECHNICAL FIELD

Embodiments of the present invention generally relate to a chip package having current control, and in particular, to a chip package having a non-uniform electrical conductance within a power delivery network of the chip package.

BACKGROUND

Electronic devices, such as tablets, computers, copiers, digital cameras, smart phones, control systems, automated teller machines, data centers, artificial intelligence system, and machine learning systems among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies are mounted to a die side (i.e., top surface) of the package substrate while a ball side (i.e., bottom surface) of the package substrate is mounted to a printed circuit board (PCB). The IC dies may include memory, logic or other IC devices.

Power delivery networks (PDN) are utilized to provide power through the package substrate to the one or more IC dies of the chip package. Interconnect routings of the PDN are generally designed to enable specific performance targets to be met. In low frequency direct current (DC) domains, the chip package design is optimized to reduce DC IR voltage drops at the IC die, well as to avoiding current crowding throughout the interconnect routing to prevent electromigration (EM) reliability issues.

In many IC die designs, the PDN is generally centered near the middle of the IC die, and surrounded by data signal transmission routings. Consequently, the PDN also is centered near the center of the package substrate. When the chip package also includes capacitor placement near the center of the package substrate to decouple high frequency alternate current (AC) switching noise, the PDN routing near the capacitor often has a heavy current load compared to PDN routing closer to the edges of the IC die.

Conventionally, voids in the ground plane are utilized to balance the current variation between the edge and center routings of the PDN. However, creating voids in the ground plane may compromise the package power integrity due to DC loop resistance and DC internal resistance increases. Additionally, creating voids in the ground plane may also increase design iteration. Since excessive current issue are typically only discovered when the package PDN routing is matured and ready for final design review, late discovery of the need to all voids in the power plane results in additional design iteration and potentially costly completion scheduling delays.

Therefore, a need exists for a chip package with an improved PDN design.

SUMMARY

A chip package and method for fabricating the same are provided that includes a power delivery network (PDN) with non-uniform electrical conductance. The electrical conductance through each current path of the PDN may be selected to balance the distribution of current flow across the current paths through the chip package, thus compensating for areas of high and low current draw found in conventional designs.

In one example, chip package includes an integrated circuit (IC) die, package substrate a die side and a ball side, a power delivery network (PDN). PDN has a plurality of conductive paths for providing power to the IC die through the package substrate. The plurality of conductive paths of the PDN includes a first conductive path and a second conductive path. The first conductive path extends from a first contact pad disposed on the ball side of the package substrate and terminates at a first contact pad disposed on the IC die. The first conductive path includes a first current control connection connecting a first metal layer to an adjacent second metal layer. The second conductive path extends from a second contact pad disposed on the ball side of the package substrate and terminates at a second contact pad disposed on the IC die. The second conductive path includes a second current control connection connecting the first metal layer to the second metal layer. The first current control connection has an electrical conductance that is greater than an electrical conductance of the second current control connection coupled between the first metal layer and the second metal layer by at least 15 percent.

In another example, a chip package includes an integrated circuit (IC) die, a package substrate a die side and a ball side, and a power delivery network (PDN). The PDN has a plurality of conductive paths for providing power to the IC die through the package substrate. The PDN includes a first conductive path and a second conductive path. The first conductive path extends from a first contact pad disposed on the ball side of the package substrate and terminates at a first contact pad disposed on the IC die. The first conductive path includes N first vias coupled in parallel between a first metal layer and an adjacent second metal layer of the PDN. N is a positive integer. The second conductive path extends from a second contact pad disposed on the ball side of the package substrate and terminates at a second contact pad disposed on the IC die. The second conductive path includes a plurality of second vias coupled between the first metal layer and the second metal layer. The second vias are disposed farther from a center of the IC die than the second vias. A number of second vias is greater than N.

In another example, a chip package includes an integrated circuit (IC) die, a package substrate a die side and a ball side, and a power delivery network (PDN). The PDN has a plurality of conductive paths for providing power to the IC die through the package substrate. The PDN includes a first conductive path and a second conductive path. The first conductive path extends from a first contact pad disposed on the ball side of the package substrate and terminates at a first contact pad disposed on the IC die. The first conductive path includes a plurality of first vias coupled in parallel between a first metal layer and an adjacent second metal layer of the PDN. The second conductive path extends from a second contact pad disposed on the ball side of the package substrate and terminates at a second contact pad disposed on the IC die. The second conductive path includes a plurality of second vias coupled between the first metal layer and the second metal layer. The second vias are disposed farther from a center of the IC die than the second vias. At least one of the second vias has a diameter greater than a diameter of at least one of the first vias.

In another example, a chip package includes an integrated circuit (IC) die, a package substrate a die side and a ball side, and a power delivery network (PDN). The PDN has a plurality of conductive paths for providing power to the IC die through the package substrate. The PDN includes a first conductive path and a second conductive path. The first conductive path extends from a first contact pad disposed on the ball side of the package substrate and terminates at a first contact pad disposed on the IC die. The first conductive path includes a plurality of first vias coupled in parallel between a first metal layer and an adjacent second metal layer of the PDN. The second conductive path extends from a second contact pad disposed on the ball side of the package substrate and terminates at a second contact pad disposed on the IC die. The second conductive path includes a plurality of second vias coupled between the first metal layer and the second metal layer. The second vias are disposed farther from a center of the IC die than the second vias. At least one of the second vias is fabricated from a material having a coefficient of electrical conductivity that is different than a material comprising at least one of the first vias.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5A is a partial sectional view of a portion of a PDN defined across two metal layers electrically coupled by a current control connection.

FIGS. 5B-5D are a partial sectional views of various examples of the current control connection taken through section line 5-5 of FIG. 5A.

FIGS. 6A-6C are a partial sectional views of additional examples of the current control connection taken through section line 5-5 of FIG. 5A.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package and method for fabricating the same are provided that includes a power delivery network (PDN) having non-uniform electrical conductance. The PDN includes a plurality of current paths utilized to provide power to one or more integrated circuit (IC) dies of the chip package. The current paths of the PDN are constructed with different electrical conductance such that the amount of current flowing through each current path may be encouraged or impeded relative to each other to enhance the distribution of current flow across the PDN. The distribution of current flow across the PDN is selected to compensate for areas of high and low current draw normally found in conventional designs which may detrimentally effect performance, heat generation and reliability of the IC die, and ultimately, the chip package.

Beneficially, the current distribution of the PDN maybe realized without increasing DC IR voltage drop. Additionally, current crowding throughout the RDL interconnect routing is reduced, thus improving electromigration (EM) reliability.

The electrical conductance of the current paths of the PDN may be controlled by selecting the resistance of the conductive paths between the metal layers comprising the PDN. The total resistance of a connection between the first and second metal layers on a single current path through the PDN may be selected by any suitable technique. For example, the number of vias may be utilized to select the total resistance of the connection. In another example, the sectional area of the one or more vias forming the connection may be utilized to select the total resistance. In another example, the material of the one or more vias forming the connection may be utilized to select the total resistance. Additionally, any combination of the number of vias, the total sectional area of the connection, and the via material(s) may be utilized to select total resistance of any one current path.

Figure 1:
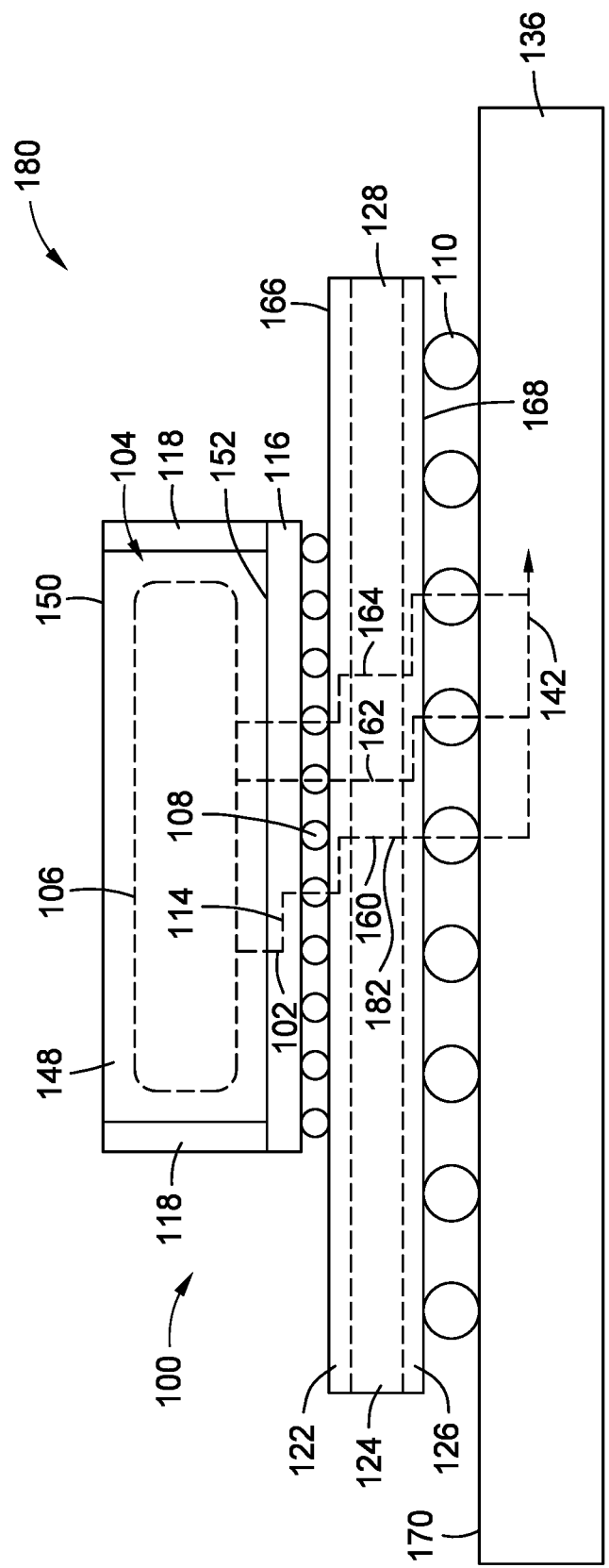
FIG. 1 is a schematic sectional view of an exemplary chip package having a power distribution network (PDN) extending through a package substrate to an integrated circuit (IC) die of the chip package.

Turning now to FIG. 1, a schematic sectional view of a chip package 100 is illustrated. The chip package 100 includes at least one integrated circuit (IC) die 104, an optional redistribution layer (RDL) 116 and a package substrate 128. The RDL 116, when present, is formed on the lower surface of the IC die 104. The RDL 116 is coupled to the package substrate 128. The package substrate 128 of the chip package 100 may be mounted on a printed circuit board (PCB) 136 to form an electronic device 180.

A PDN 102 is utilized to provide power from the PCB 136 to the IC die 104 of the chip package 100. The PDN 102 generally consists of all the interconnects and traces from the PCB 136 to the IC die 104, including all bulk and ceramic decoupling capacitors, power and ground planes, the intervening vias, traces and the relevant leads, solder balls, wire-bonds, and the like of the chip package 100. The PDN 102 generally includes a plurality of separate conductive paths disposed defined between PCB 136 and the IC die 104, three of which are shown in FIG. 1 as a first PDN conductive path 160, a second PDN conductive path 162, and a third PDN conductive path 164. Although only three PDN conductive paths 160, 162, 164 are illustrated in FIG. 1, generally the number of PDN conductive paths utilized in an exemplary chip package is generally about less than about 30 percent of the number of solder balls 110 connecting the package substrate 128 to the PCB 136, although the number may vary greatly depending on the number and types of IC dies 104 comprising the chip package 100.

Each PDN conductive path includes a current control connection disposed between and connecting two adjacent metal layers that are part of the PDN 102. The current control connection functions to control the electrical conductance of one PDN conductive path relative to another. Generally, the construction of the current control connection is selected to control the electrical conductance between the two adjacent metal layers of the PDN conductive path such that one PDN conductive path may be configured to have a different electrical conductance compared to another PDN conductive path. The current control connection is configured to set the total resistance of the PDN conductive path between the two adjacent metal layers. Since less current will flow through current control connections having higher resistance, the amount of current flowing through each current control connection, and thus each PDN conductive path, may be selected have more current flowing through one PDN conductive path relative to another PDN conductive path, thereby controlling the amount and distribution of current flowing across the entire PDN 102. The three PDN conductive paths 160, 162, 164 and current control connection are discuss in greater detail below.

Continuing to refer to FIG. 1, the IC die 104 of the chip package 100 includes functional circuitry 106. The functional circuitry 106 may include block random access memory (BRAM), UltraRAM (URAM), digital signal processing (DSP) blocks, configurable logic elements (CLEs), and the like. The IC die 104 may be, but is not limited to, programmable logic devices, such as field programmable gate arrays (FPGA), memory devices, such as high bandwidth memory (HBM), optical devices, processors or other IC logic structures. The IC die 104 may optionally include optical devices such as photo-detectors, lasers, optical sources, and the like. In the example of FIG. 1, the IC die 104 is a logic die having math processor (also known as math engine) circuitry for accelerating machine-learning math operations in hardware, such as self-driving cars, artificial intelligence and data-center neural-network applications.

Optionally, the at least one IC die 104 may be a plurality of IC dies 104. When a plurality of IC dies 104 are utilized, the IC dies 104 may be disposed in a vertical stack and/or disposed laterally side by side. It is contemplated that the IC dies 104 comprising the plurality of IC dies 104 may be the same or different types. Although only one IC die 104 is shown in FIG. 1, the number of IC dies 104 disposed in the chip package 100 may vary from one to as many as can fit within the chip package 100. Additionally, one or more of the IC dies 104 may optionally be configured as a chiplet.

The IC die 104 includes a die body 148 having a die bottom surface 152 and a die top surface 150. The functional circuitry 106 is disposed within the die body and includes routing that terminates on the die bottom surface 152 of the IC die 104, for example at contact pads (later shown in FIG. 2).

The RDL 116, when present, is formed on the contact pads exposed on the die bottom surface 152 of the IC die 104. The RDL 116 includes routing formed from a plurality of patterned metal layers disposed between a plurality of dielectric layers. The patterned metal layers are coupled by vias to form interconnect circuitry 114 of the RDL 116 that connect the functional circuitry 106 to package circuitry 182 formed in the package substrate 128. In the example depicted in FIG. 1, the interconnect circuitry 114 of the RDL 116 is electrically and mechanically coupled to the package circuitry 182 formed in the package substrate 128 by interconnects 108. In one example, the interconnects 108 are solder connections, such as solder bumps. The interconnects 108 may alternatively be formed by a hybrid bond layer or other suitable technique. As noted above, portions of the interconnect circuitry 114 of the RDL 116 and the package circuitry 182 formed in the package substrate 128 that are configured to carry power to the IC die 104 are part of the PDN 102.

In some examples such as depicted in FIG. 1, the RDL 116 is wider than the IC die 104 to accommodate a fan out using interconnect circuitry 114 of the RDL 116. When the RDL 116 is wider than the IC die 104, a mold compound 118 surrounding the lateral sides of the IC die 104 may be utilized to provide structural support for portions of the RDL 116 that extend beyond the sides of the IC die 104.

Figure 1A:
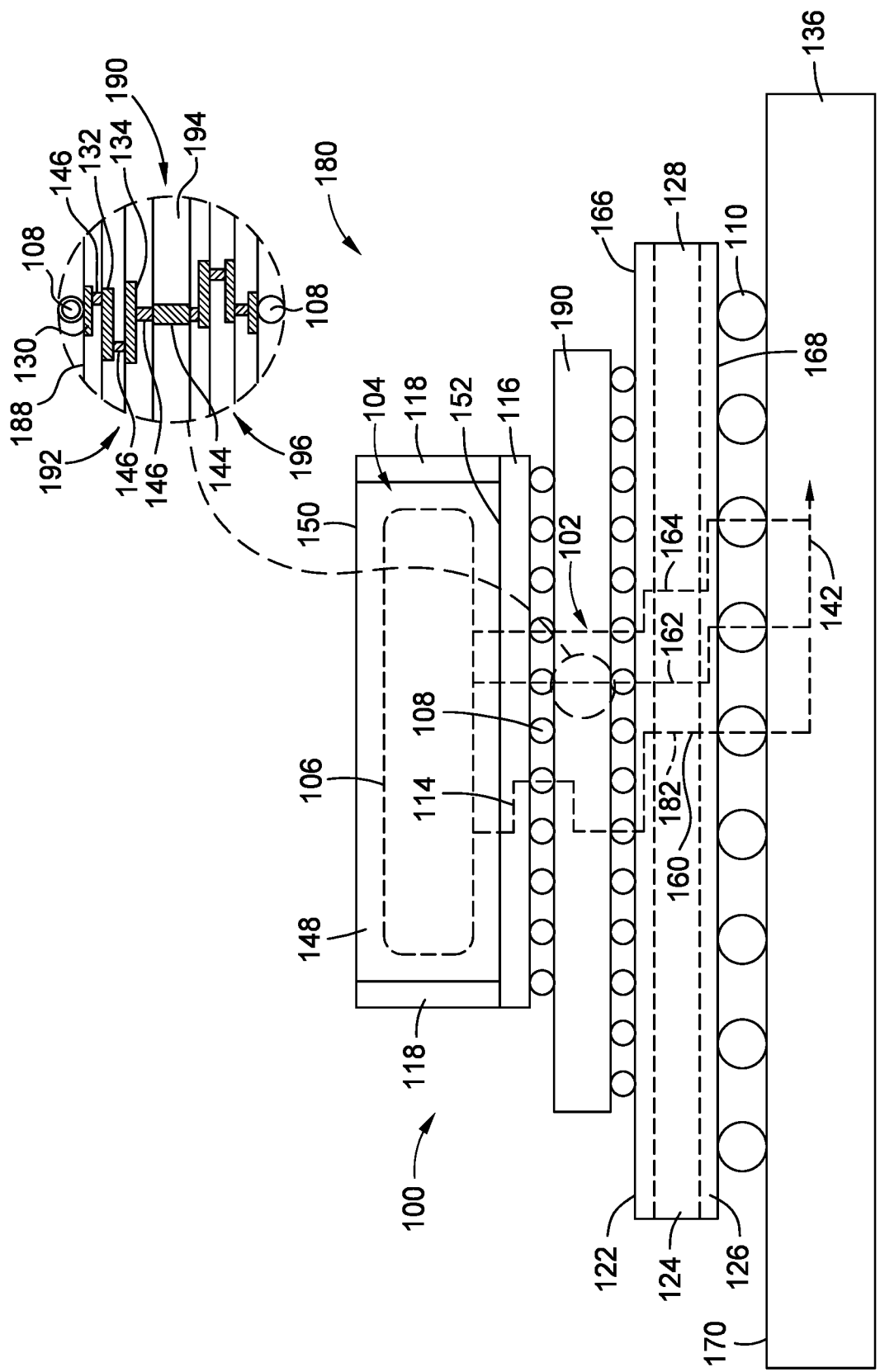
FIG. 1A is a schematic sectional view of another example of a chip package having PDN extending through a package substrate and an interposer to an IC die of the chip package.

Although the RDL 116 is shown disposed contacting the IC die 104 in FIG. 1, the RDL 116 may alternatively or additionally be located in other portions of the chip package 100 illustrated in FIG. 1, or other chip packages having alternative configurations. For example as depicted in FIG. 1A, the chip package 100 includes an interposer 190 disposed between the package substrate 128 and the IC die 104. The interposer 190 generally includes at least an upper build-up layer 192 disposed on a core 194. Optionally, a lower build-up layer 196 may be disposed on the other side of the core 194 from the upper build-up layer 192. The upper build-up layer 192 includes a plurality of conductive layers and vias that are patterned to provide routing of the interposer circuitry 198. Exemplary conductive layers and vias of upper build-up layer 192 are illustrated as a first metal layer 130 coupled to a second metal layer 132 by a via 134. When the first metal layer 130, the second metal layer 132, and the via 134 are part of the PDN 102, the via 134 maybe configured as a current control connection. One end of the interposer circuitry 198 formed in the upper build-up layer 192 terminates at the bond pad formed on a top surface 188 of the interposer 190 where the interposer circuitry 198 connects to the interconnect circuitry 114 of the RDL 116. The other end of the interposer circuitry 198 formed in the upper build-up layer terminates at vias formed through the core 194. The lower build-up layer 196 may be fabricated similar to the upper build-up layer 192, the lower build-up layer 196 optionally including a via 134 configured as a current control connection. At least one of the upper and lower build-up layers 192, 196 includes a fan out in the circuitry 198 of the interposer 190.

In examples where the interposer 190 does not include a lower build-up layer 196, the vias formed through the core 194 of the interposer circuitry 198 may be connected by interconnects 108 to the package circuitry 182 of the package substrate 128. In examples having a lower build-up layer 196, the vias formed through the core 194 are coupled through the patterned conductive layers and vias of the lower build-up layer 196 such that the interposer circuitry 198 again is connected by interconnects 108 to the package circuitry 182 of the package substrate 128. At the package bottom surface 168, the package circuitry 182 is coupled to the circuitry 142 of the PCB 136 by the solder balls 110. As noted above, the power carrying conductors of the interposer circuitry 198 are part of the PDN 102, and the PDN portions of the interposer circuitry 198 may include one or more vias configured as current control connections.

As shown in FIG. 1A, the chip package 100 illustrates an RDL 116 disposed in three alternative locations. The chip package 100 of FIG. 1A may have the RDL 116 in any one of the locations shown, any two of the locations shown, or all of the locations shown in FIG. 1A. As the PDN 102 runs through the RDLs, any one, two or more of the RDLs may include a current control connection. For example, a current control connection may be disposed on any one of the RDLs 116 shown, any two of the RDLs 116 shown, or all of the RDLs 116 shown in FIG. 1A. In FIG. 1A, the RDL 116 is disposed on both sides of the interposer 190, and on the bottom surface 152 of the IC die 104.

Figure 2:
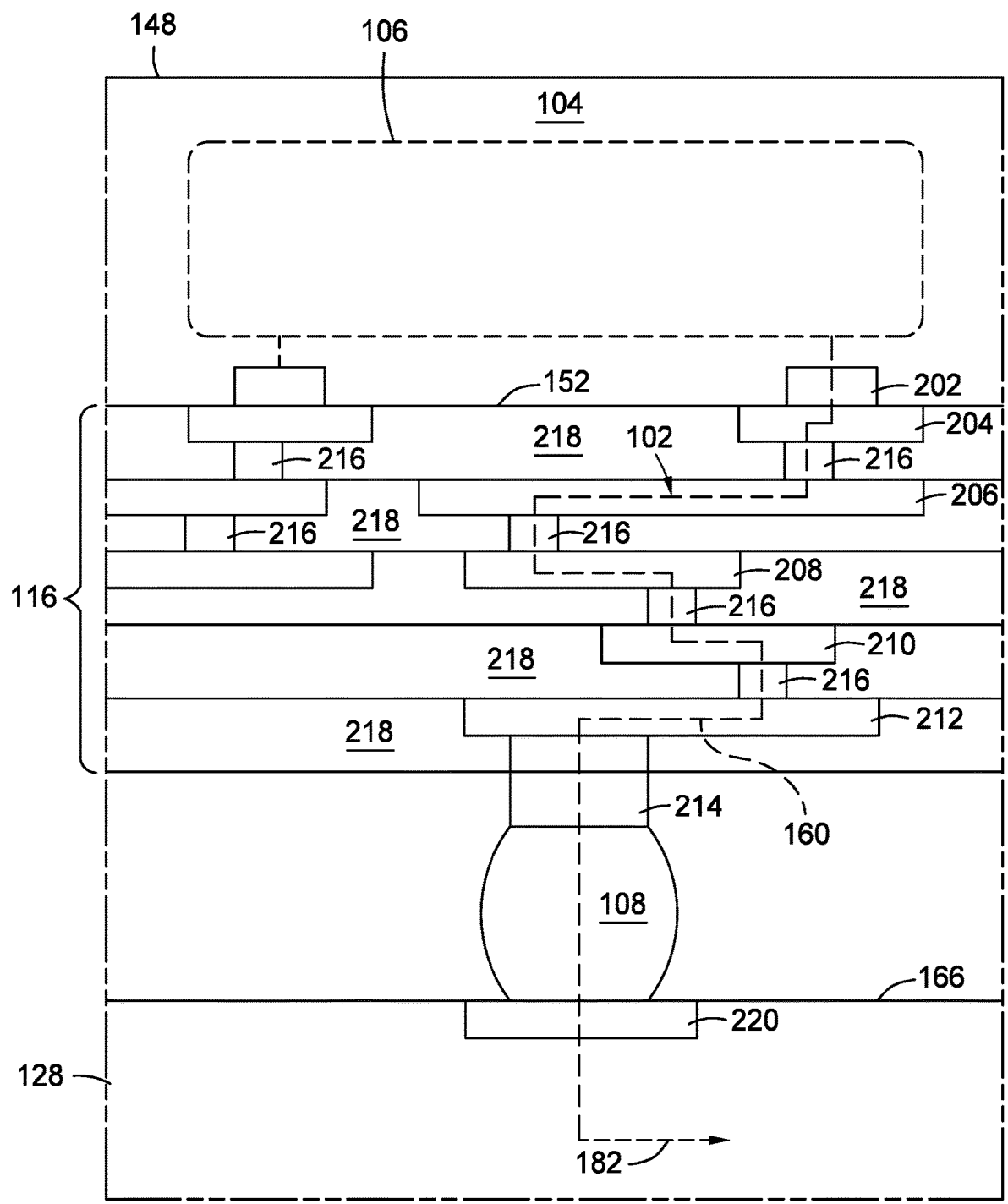
FIG. 2 is a schematic sectional view of a portion of the chip package illustrating one example of the connections between an integrated circuit (IC) die and a package substrate through a redistribution layer (RDL).

FIG. 2 is a schematic sectional view of a portion of the chip package 100 illustrating one example of the connections between the IC die 104 and the package substrate 128 through the RDL 116.

The RDL 116 includes a plurality of conductive layers and vias 216 which are patterned to form the RDL circuitry 114. There can be between two to seven patterned conductive layers forming the RDL circuitry 114. In the example of FIG. 2, five conductive layers 204, 206, 208, 210, 212 are shown, although a different number of conductive layers may be utilized. The conductive layers 204, 206, 208, 210, 212 are patterned to form lines that are connected by vias 216 to form the RDL circuitry 114. The patterned conductive layers 204, 206, 208, 210, 212 are separated by dielectric layers 218.

The one end of the routings comprising the RDL circuitry 114 terminates at the first conductive layer 204. The routing terminations of RDL circuitry 114 at the first conductive layer 204 are coupled to contact pads 202 formed on the bottom surface 152 of the IC die 104. The other end of the routings comprising the RDL circuitry 114 terminates at the last conductive layer 212. The routing terminations of RDL circuitry 114 at the last conductive layer 212 are coupled to an under-bump layer 214 upon which the interconnect 108 is formed. The interconnect 108 couples the RDL circuitry 114 to a bond pad formed on a top surface 166 of the package substrate 128, thus connecting the RDL circuitry 114 to the package circuitry 182 of the package substrate 128.

The PDN 102 extends through the portion of the RDL circuitry 114 circuitry that is configured to carry power the IC die 104. In FIG. 2, the first PDN conductive path 160 is illustrated routed through the patterned conductive layers 204, 206, 208, 210, 212 and the vias 216 of the RDL circuitry 114. Optionally, one or more of the vias 216 may be configured as a current control connection of the first PDN conductive path 160.

Returning back to FIG. 1, the package substrate 128 generally includes at least an upper build-up layer 122 disposed on a core 124. Optionally, a lower build-up layer 126 may be disposed on the other side of the core 124 from the upper build-up layer 122. The upper build-up layer 122 includes a plurality of conductive layers and vias that are patterned to provide routing of a portion of the package circuitry 182. One end of the package circuitry 182 formed in the upper build-up layer 122 terminates at the bond pad formed on the top surface 166 of the package substrate 128 where the package circuitry 182 connects to the interconnect circuitry 114 of the RDL 116. The other end of the package circuitry 182 formed in the upper build-up layer terminates at vias formed through the core 124. The lower build-up layer 126 may be fabricated similar to the upper build-up layer 122. At least one of the upper and lower build-up layers 122, 126 includes a fan out in the circuitry 182 of the package substrate 128.

In examples where the package substrate 128 does not include a lower build-up layer 126, the vias formed through the core 124 of the package circuitry 182 may be connected by solder balls 110 to circuitry 142 of the PCB 136 that terminates at a PCB top surface 170 of the PCB 136. In examples having a lower build-up layer 126, the vias formed through the core 124 are coupled through the patterned conductive layers and vias of the lower build-up layer 126 such that the package circuitry 182 terminates at a package bottom surface 168. At the package bottom surface 168, the package circuitry 182 is coupled to the circuitry 142 of the PCB 136 by the solder balls 110.

Figure 3:
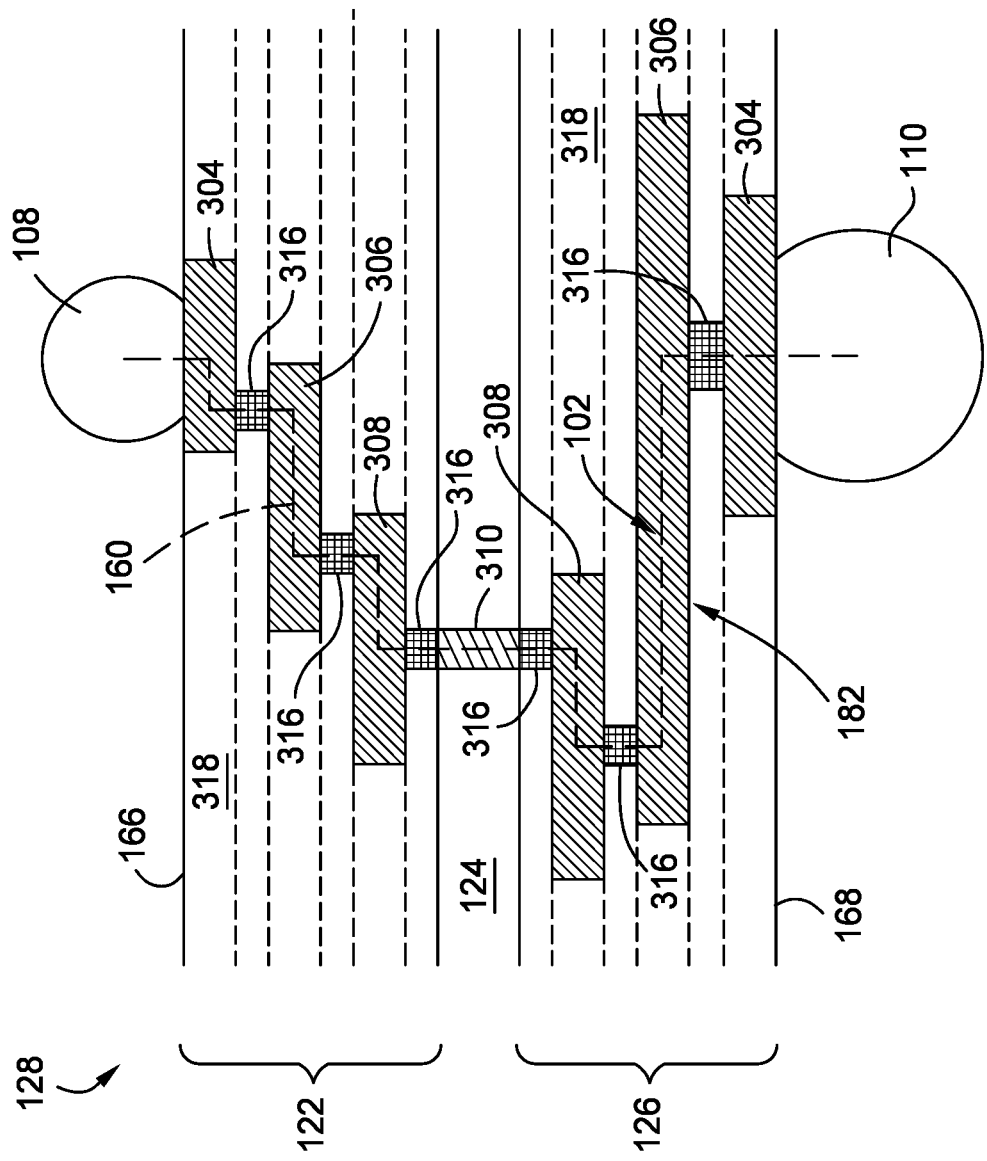
FIG. 3 is a schematic sectional view of a portion of the package substrate illustrating one example of the connections between an integrated circuit (IC) die and a package substrate through a redistribution layer (RDL).

FIG. 3 is a schematic sectional view of a portion of the package substrate 128 illustrating the upper build-up layer 122 and the lower build-up layer 126 in greater detail. The upper build-up layer 122 includes a plurality of conductive layers and vias 316 which are patterned to form the package circuitry 182. There can be between two to seven patterned conductive layers forming the package circuitry 182 within the upper build-up layer 122. In the example of FIG. 3, three conductive layers 304, 306, 308 are shown, although a different number of conductive layers may be utilized. The conductive layers 304, 306, 308 are patterned to form lines that are connected by vias 316 to form the portion of the package circuitry 182 extending through the upper build-up layer 122. The patterned conductive layers 304, 306, 308 are separated by dielectric layers 318.

The package circuitry 182 extending through the upper build-up layer 122 terminates at a via 310 extending through the core 124 of the package substrate 128. The via 310 connects the portion of the package circuitry 182 residing in the upper build-up layer 122 with the portion of the package circuitry 182 residing in the lower build-up layer 126. The portion package circuitry 182 residing in the lower build-up layer 126 is generally configured the same as the portion package circuitry 182 residing in the upper build-up layer 122. That is, the portion of the package circuitry 182 residing in the lower build-up layer 126 generally includes conductive layers 304, 306, 308 patterned to form lines that are connected by vias 316 to form the portion of the package circuitry 182 extending through the lower build-up layer 126.

The portion of the package circuitry 182 residing in the upper build-up layer 122 terminates at the bond pad formed on the top surface 166 of the package substrate 128 where the package circuitry 182 connects to the interconnect circuitry 114 of the RDL 116. The portion of the package circuitry 182 extending through the lower build-up layer 126 terminates at the bond pad formed on the bottom surface 168 of the package substrate 128 where the package circuitry 182 connects to the PCB circuitry 142 of the PCB 136.

The portion of the package circuitry 182 that carries power is part of the PDN 102 as described above. In FIG. 3, the first PDN conductive path 160 is illustrated routed through the patterned conductive layers 304, 306, 308 and the vias 310, 316 of the package circuitry 182 formed in the package substrate 128. Optionally, one or more of the vias 316 may be configured as a current control connection of the first PDN conductive path 160.

Thus, in summary, any one or more of the vias 146, 216, 316 of any of the PDN conductive paths of the PDN 102 may be configured as a current control connection. The total electrical conductance across each current control connection is selected so that one PDN conductive path be configured to carry more or less current than another one of the PDN conductive paths. In this manner, the amount of electrical current carried by one PDN conductive path relative to another PDN conductive path may be selected to control the current distribution across the PDN 102.

Advantageously, by independently setting by selection of the physical characteristics of each current control connection, regions of conventional PDNs that would normally be subject to undesirable high current flow in conventional designs may be mitigated while inducing additional current flow in regions of conventional PDNs that would normally be subject to low current flow. In other words, the current control connections are utilized to homogenize current distribution across the package ball grid array utilized in the PDN. Thus, the current control connections may be utilized to produce a non-uniform distribution of electrical conductance within the PDN that promotes better and more reliable IC die performance.

Figure 4:
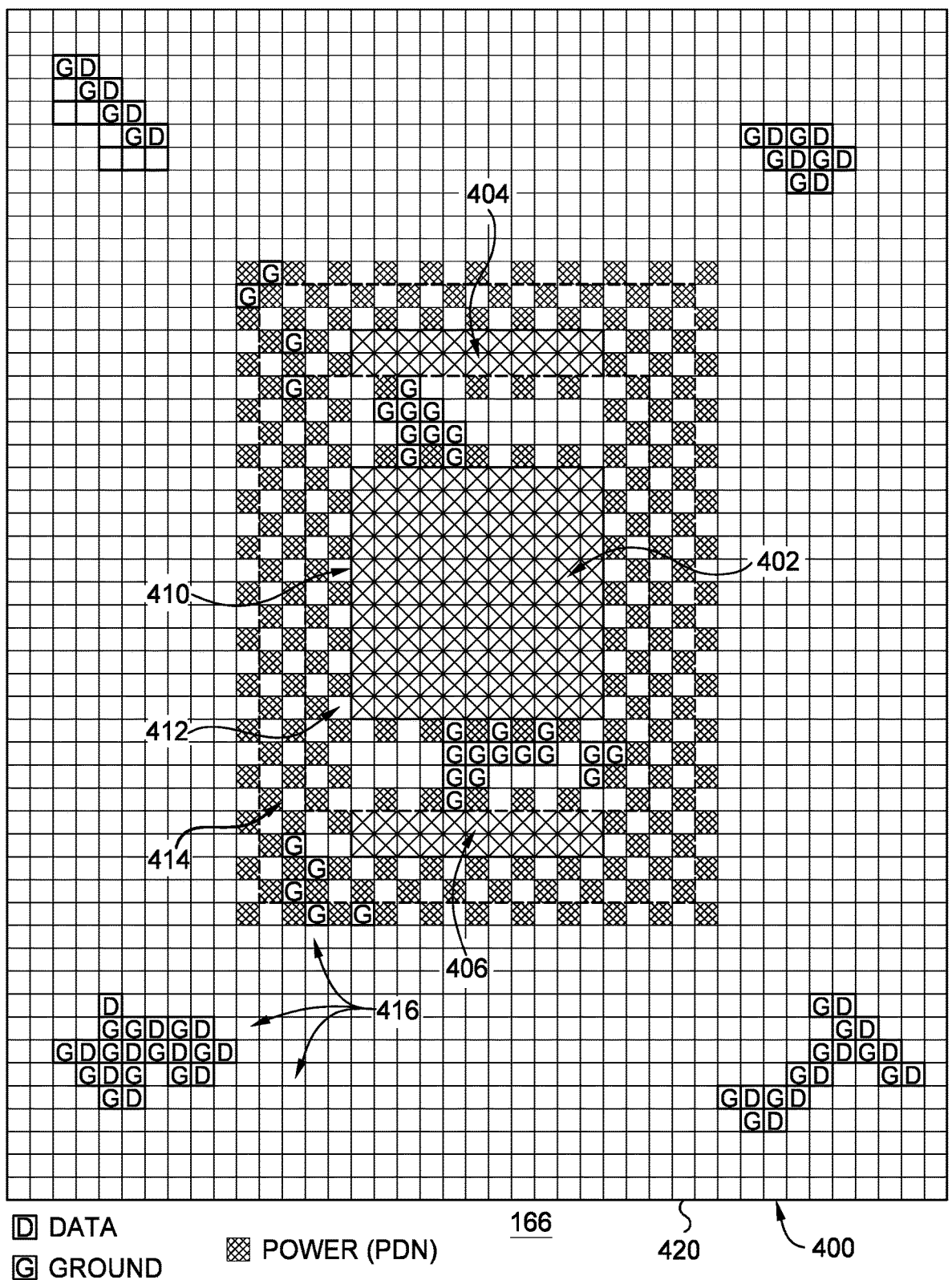
FIG. 4 is a schematic representation of bond pad array disposed on a top surface of a package substrate that is configured to receive an IC die of the chip package.

FIG. 4 is a schematic representation of bond pad array 400 disposed on the top surface 166 of the package substrate 128 that is configured to receive an IC die 104 of the chip package 100. The configuration of the bond pad array 400 is merely provided as an example, and bond pad arrays having other configurations may be utilized.

The bond pad array 400 generally includes a plurality of bond pads 220. In the example depicted in FIG. 4, the bond pads 220 are arranged in rows and columns that have a mirror image of the solder interconnects 108 formed the RDL 116 when present, or the contact pads 202 formed on the bottom surface 152 of the IC die 104 when the RDL 116 is not present. The bond pad array 400 has an area 402 that is at least as large as the area of the IC die 104 to which the bond pad array 400 is mated. When the RDL 116 provides a fan out below the IC die 104, the area 402 is at least as large as the area of the RDL 116.

The bond pads 220 of the bond pad array 400 are generally configured to carry power, ground and data signals. Some bond pads 220 are not configured to carry power, ground and data signals, and function to balance the distribution of metal on or near the top surface 166 of the package substrate 128 to mitigate warpage due to mismatches in the coefficient of thermal expansion of the materials comprising the package substrate 128. In FIG. 4, bond pads 220 configured to carry power that are part of the PDN 102 are identified with a being filled with cross hatching, bond pads 220 configured for coupling to ground are identified with a "G", while bond pads 220 configured to carry data signals are identified with a "D". Not all the bond pads 220 of the bond pad array 400 are identified as being configured to carry power, ground and data signals to avoid cluttering FIG. 4, and those bond pads 220 may be configured to carry power, ground and data signals as desired for a particular implementation of the chip package 100.

A depopulated region 402 is located at or near a center region 410 of the bond pad array 400. The depopulated region 402 may include bond pads 220 identified with an "X" that are not coupled to the circuitry 106 of the IC die 104. One or more additional depopulated region 404 are located adjacent the depopulated region 402 near the center of the bond pad array 400. The depopulated regions 404 may also include bond pads 220 identified with an "X". The depopulated regions 402, 404 generally do not include solder connections 108 with the IC die 104 to provide space for decoupling capacitors (not show) that are interfaced with the PDN 102.

As illustrated in FIG. 4, there is a greater density of hatched bond pads 220 (e.g., bond pads utilized to carry power) utilized adjacent the depopulated regions 402, 404. This is because many IC dies 104 concentrate power connections at or near the center region of the IC die 104. As such, as the hatched bond pads 220 closer to the center region 410 generally have a tendency to carry more current than the hatched bond pads 220 closer to the outer edges 420 of the bond pad array 400. To counter the tendency to carry more current near the center of the bond pad array 400, the PDN conductive paths of the PDN 102 that include hatched bond pads 220 closer to the center region 410 have current control connections configured to be less electrically conductive (i.e., have more resistance) relative to the hatched bond pads 220 closer to the outer edges 420 of the bond pad array 400. In FIG. 4, the hatched bond pads 220 are grouped in three regions: a first region 412 immediately outward of the depopulated region 402 located at the center region 410 of the bond pad array 400, a second region 414 immediately outward of the first region 412 and the second depopulated regions 404 located at the center region 410 of the bond pad array 400, and a third region 416 immediately outward of the second region 414 and extending to the edges 420 of the bond pad array 400. Generally, one or more of the PDN conductive paths of the PDN 102 that include hatched bond pads 220 in the first region 412 have current control connections that are less electrically conductive than one or more of the PDN conductive paths of the PDN 102 that include hatched bond pads 220 in the second region 414. Similarly, one or more of the PDN conductive paths of the PDN 102 that include hatched bond pads 220 in the second region 414 have current control connections that are less electrically conductive than one or more of the PDN conductive paths of the PDN 102 that include hatched bond pads 220 in the third region 416. The net result is that the uniform electrical conductance of the current control connections across the PDN 102 retard current flow near the center region 410 of the bond pad array 400, while promoting current flow away from the center region 410 of the bond pad array 400, thus providing a more balanced distribution of current flow across the PDN 102 which promotes performance and reliability of the IC dies 104 of the chip package 100. Some non-limiting examples of how the current control connections controls electrical conductance through a PDN conductive path of the PDN 102 is further described below with reference to FIGS. 5A-5D, and FIGS. 6A-6C.

FIG. 5A is a partial sectional view of a portion of the PDN conductive path 160 of the PDN 102 defined across two metal layers 502, 506 electrically coupled by a current control connection 504. The PDN conductive path 160 may be alternatively be the PDN conductive path 162, 164 or another PDN conductive path of the PDN 102. In one example, the metal layer 502 is the top metal layer, i.e., the metal layer closest to the top surface 166. When metal layer 502 is the top metal layer, the construction of the current control connection 504 may be adjusted late in the design cycle, if needed, at minimal costs.

The current control connection 504 may be used in place of any one or more of the vias 134, 216, 316 that are part of a PDN conductive path. The current control connection 504 is generally selected to control the electrical conductance the PDN conductive path 160 between the metal layers 502, 506. As such, the electrical conductance of the current control connection 504 present in the PDN conductive path 160 is different than current control connection 504 present in the PDN conductive path 162. Similarly, the electrical conductance of the current control connection 504 present in the PDN conductive path 162 is different than current control connection 504 present in the PDN conductive path 164. In an example where the PDN conductive path 160 passes through the first region 412, the PDN conductive path 162 passes through the second region 414, and the PDN conductive path 164 passes through the third region 416, the electrical conductance of the current control connection 504 present in the PDN conductive path 160 is less than the electrical conductance of the current control connection 504 present in the PDN conductive path 162, and the electrical conductance of the current control connection 504 present in the PDN conductive path 162 is less than the electrical conductance of the current control connection 504 present in the PDN conductive path 164.

In one example, the electrical conductance of one current control connection 504 may different than the electrical conductance of another current control connection 504 by fabricating one current control connection 504 from a material having an electrical resistance or a coefficient of electrical conductivity greater than a material used to fabricate another control connection 504. For example, one current control connection 504 may be fabricated from solid copper while another current control connection 504 may be fabricated from copper filled with carbon nano-tubes. In another example, one current control connection 504 may be fabricated from solid copper while another current control connection 504 may be fabricated from copper filled with carbon nano-tubes. In another example, one current control connection 504 may be fabricated from copper while another current control connection 504 may be fabricated from tungsten. The materials of one or more current control connections 504 closer to the center of the array 400 are fabricated from a material having coefficient of electrical conductivity less than of one or more current control connections 504 located further from the center of the array 400.

FIGS. 5B-5D are a partial sectional views of various examples of the current control connection 504 taken through section line 5-5 of FIG. 5A. In the examples depicted in FIGS. 5B-5D, the number of vias 510 defining the current control connections 504 is varied, thus increasing (or decreasing) the electrical conductance between the metal layers 502, 506 through the current control connections 504. The current control connections 504 formed from more vias 510 generally have less resistance and consequently more electrical conductance. Accordingly, by selecting the number of vias 510 in the conductive path 160 between the metal layers 502, 506, the electrical conductance between the metal layers 502, 506 through the current control connections 504 can be selected to either raise or lower the electrical conductance of one conductive path 160 relative to another conductive path of the PDN 102.

Comparing the current control connections 504 illustrated in FIGS. 5B-5D, the current control connection 504 of FIG. 5B has fewer vias 510 and less electrical conductance than the current control connection 504 of FIG. 5C. Similarly, the current control connection 504 of FIG. 5C has fewer vias 510 and less electrical conductance than the current control connection 504 of FIG. 5D. Thus, by using the current control connection 504 of FIG. 5D in the third region 416, current control connection 504 of FIG. 5C in the second region 414, and the current control connection 504 of FIG. 5B in the third region 416, the current flowing through the PDN 102 may be balanced to mitigate tendencies of the PDN 102 to flow more current closer to the center region 410 of the bond pad array 400.

In the examples illustrated in FIGS. 5B-5D, the current control connection 504 of FIG. 5B has about electrical conductance is at least 15 percent less, such as at least 25 percent less or at least 50 percent less, than the electrical conductance of the current control connection 504 of FIG. 5C. Similarly, the current control connection 504 of FIG. 5C has about electrical conductance is at least 15 percent less, such as at least 25 percent less or at least 50 percent less, than the electrical conductance than the current control connection 504 of FIG. 5D. In one example, the number of vias 510 utilized to fabricate the current control connection 504 of FIG. 5B is less than 6, while the number of vias 510 utilized to fabricate the current control connection 504 of FIG. 5D is greater than 6.

Although the vias 510 comprising the current control connections 504 of FIGS. 5B-5D are illustrated as having a common diameter, the diameter of the vias 510 may also be varied to set the resistance, and hence the electrical conductance, across each current control connection 504. Additionally or alternatively to changes in via 510 diameter, the material of the vias 510 may also be varied to set the resistance, and hence the electrical conductance, across each current control connection 504.

FIGS. 6A-6C are a partial sectional views of additional examples of the current control connection 504 taken through section line 5-5 of FIG. 5A. In the examples depicted in FIGS. 6A-6C, the diameter of vias defining the current control connections 504 is varied, thus increasing (or decreasing) the electrical conductance between the metal layers 502, 506 through the current control connections 504. The current control connections 504 formed from more vias have less resistance and consequently more electrical conductance. Accordingly, by selecting the diameter of the vias comprising the current control connection 504 of the conductive path 160 between the metal layers 502, 506, the electrical conductance between the metal layers 502, 506 through the current control connections 504 can be selected to either raise or lower the electrical conductance of one conductive path 160 relative to another conductive path of the PDN 102.

Comparing the current control connections 504 illustrated in FIGS. 6A-6C, the current control connection 504 of FIG. 6A has smaller diameter vias 610 and less electrical conductance than the vias 620 of the current control connection 504 of FIG. 6B. Similarly, the current control connection 504 of FIG. 6B has smaller diameter vias 620 and less electrical conductance than the diameters of the vias 630 of the current control connection 504 of FIG. 6C. Thus, by using the current control connection 504 of FIG. 6C in the third region 416, current control connection 504 of FIG. 6B in the second region 414, and the current control connection 504 of FIG. 6A in the first region 416, the current flowing through the PDN 102 may be balanced to mitigate tendencies of the PDN 102 to flow more current closer to the center region 410 of the bond pad array 400.

In the examples illustrated in FIGS. 6A-6C, the current control connection 504 of FIG. 6A has about electrical conductance is at least 15 percent less, such as at least 25 percent less or at least 50 percent less, than the electrical conductance of the current control connection 504 of FIG. 6B. Similarly, the current control connection 504 of FIG. 6B has about electrical conductance is at least 15 percent less, such as at least 25 percent less or at least 50 percent less, than the electrical conductance than the current control connection 504 of FIG. 6C. In one example, the number of vias 610 utilized to fabricate the current control connection 504 of FIG. 6A is less than 6, while the number of vias 630 utilized to fabricate the current control connection 504 of FIG. 6C is greater than 6.

Although the vias comprising the current control connections 504 of FIGS. 6A-6C are illustrated as having the same number of vias, the number of the vias may also be varied to set the resistance, and hence the electrical conductance, across each current control connection 504. Additionally or alternatively to changes in via number of via, the material of the vias may also be varied to set the resistance, and hence the electrical conductance, across each current control connection 504.

Thus, a chip package and method for fabricating have been described that includes a power delivery network (PDN) configured to improve the distribution of electrical current delivered to the IC die(s) of the chip package by select. The non-uniform electrical conductance of the current paths is utilized to manage the amount of current flowing through each current path, thus mitigating occurrences of undesirably high and low current paths. In other words, the current control connections are utilized to homogenize current distribution across the package ball grid array utilized in the PDN. By controlling the distribution of current flowing in the various paths of the PDN, areas of high and low current draw normally found in conventional designs are moderated, which accordingly enhances performance, reduces heat generation and improves reliability of the IC die, and ultimately, the chip package.

While the foregoing is directed to embodiments of the present invention, other and further embodiments of the invention may be devised without departing from the basic scope thereof, and the scope thereof is determined by the claims that follow.

What is claimed is:

1. A chip package comprising:
   an integrated circuit (IC) die;
   a package substrate having a die side and a ball side;
   a power delivery network (PDN) having a plurality of conductive paths for providing power to the IC die through the package substrate, the plurality of conductive paths of the PDN comprising:
      a first conductive path extending from a first contact pad disposed on the ball side of the package substrate and terminating at a first contact pad disposed on the IC die, the first conductive path comprising a first current control connection connecting a first metal layer to an adjacent second metal layer; and
      a second conductive path extending from a second contact pad disposed on the ball side of the package substrate and terminating at a second contact pad disposed on the IC die, the second conductive path comprising a second current control connection connecting the first metal layer to the second metal layer, wherein an electrical conductance of the first current control connection is greater than the second current control connection coupled between the first metal layer and the second metal layer by at least 15 percent.

2. The chip package of claim 1, wherein the first current control connection is farther from a center of the IC die than the second current control connection.

3. The chip package of claim 1, wherein the first current control connection further comprise N first vias coupled in parallel between the first metal layer and the second metal layer; and wherein N is a positive integer; and
   wherein a number of second vias coupled in parallel that comprise the second current control connection is less than N.

4. The chip package of claim 3, wherein there are at least twice as many second vias than first vias.

5. The chip package of claim 3, wherein the one or more first vias are farther from a center of the IC die than the one or more second vias.

6. The chip package of claim 3, wherein N is greater than 6.

7. The chip package of claim 3, wherein the second conductive path is closer to a decoupling capacitor than the second conductive path.

8. The chip package of claim 1, wherein the first current control connection comprises at least one via that has a sectional area greater than a sectional area of at least one via of the second current control connection.

9. The chip package of claim 1, wherein the first current control connection comprises at least one via fabricated from a material having a coefficient of electrical conductivity that is different than a coefficient of electrical conductivity at least one via of the second current control connection.

10. The chip package of claim 1 further comprising:
    a third conductive path extending from a third contact pad disposed on the ball side of the package substrate and terminating at a third contact pad disposed on the IC die, the third conductive path comprising a third current control connection coupled between the first metal layer and the second metal layer, wherein the electrical conductance of the second current control connection is less than an electrical conductance of the third current control connection by at least 15 percent.

11. The chip package of claim 10, wherein the third current control connection are farther from the center of the IC die than the second current control connection.

12. The chip package of claim 10, wherein there are less vias comprising the second current control connection than vias comprising the third current control connection.

13. The chip package of claim 12, wherein there are at least twice as many vias comprising the third current control connection than vias comprising the first current control connection.

14. The chip package of claim 12, wherein the vias comprising the third current control connection are farther from the center of the IC die than in the second current control connection and in the second current control connection.

15. The chip package of claim 1, wherein the package substrate further comprises the first and second metal layers.

16. The chip package of claim 1 further comprising:
    a redistribution layer disposed in contact with a bottom surface of the IC die, the redistribution layer further comprising the first and second metal layers.

17. The chip package of claim 1 further comprising:
    an interposer disposed between the package substrate and the IC die, the interposer further comprising the first and second metal layers.

18. A chip package comprising:
    an integrated circuit (IC) die;
    a package substrate having a die side and a ball side;
    a power delivery network (PDN) having conductive paths for providing power to the IC die through the package substrate, the PDN comprising:
       a first conductive path extending from a first contact pad disposed on the ball side of the package substrate and terminating at a first contact pad disposed on the IC die, the first conductive path comprising N first vias coupled in parallel between a first metal layer and an adjacent second metal layer of the PDN, wherein N is a positive integer; and
       a second conductive path extending from a second contact pad disposed on the ball side of the package substrate and terminating at a second contact pad disposed on the IC die, the second conductive path comprising a plurality of second vias coupled in parallel between the first metal layer and the second metal layer, the second vias disposed farther from a center of the IC die than the first vias, wherein a number of second vias is greater than N.

19. The chip package of claim 18, wherein there are at least 3 or more second vias than first vias.

20. The chip package of claim 18 further comprising:
    a third conductive path extending from a third contact pad disposed on the ball side of the package substrate and terminating at a third contact pad disposed on the IC die, the third conductive path comprising one or more third vias coupled between the first metal layer and the second metal layer, wherein there are there are at least 2 or more third vias than the one or more second vias, and there are at least 2 or more second vias than first vias.

* * * * *